United States Patent

Grodzki et al.

(10) Patent No.: US 10,422,843 B2
(45) Date of Patent: Sep. 24, 2019

(54) METHOD AND APPARATUS FOR MODIFICATION OF A MAGNETIC RESONANCE ACTUATION SEQUENCE

(71) Applicant: Siemens Healthcare GmbH, Erlangen (DE)

(72) Inventors: David Grodzki, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 175 days.

(21) Appl. No.: 15/337,063

(22) Filed: Oct. 28, 2016

(65) Prior Publication Data

US 2017/0123031 A1  May 4, 2017

(30) Foreign Application Priority Data

Oct. 28, 2015 (DE) .................. 10 2015 221 051

(51) Int. Cl.
  *G01V 3/00* (2006.01)
  *G01R 33/54* (2006.01)
  *G01R 33/385* (2006.01)

(52) U.S. Cl.
  CPC ......... *G01R 33/543* (2013.01); *G01R 33/385* (2013.01)

(58) Field of Classification Search
  CPC .............. G01R 33/543; G01R 33/482; G01R 33/4824; G01R 33/3854; G01R 33/56509; G01R 33/56572
  USPC ........................................................ 324/309
  See application file for complete search history.

(56) References Cited

U.S. PATENT DOCUMENTS

| | | | |
|---|---|---|---|
| 6,636,038 B1 | 10/2003 | Heid | |
| 9,945,919 B2* | 4/2018 | Zuehlsdorff | G01R 33/543 |
| 2013/0271139 A1* | 10/2013 | Grodzki | G01R 33/543 324/314 |
| 2014/0232396 A1* | 8/2014 | Grodzki | G01R 33/543 324/309 |
| 2014/0232397 A1* | 8/2014 | Grodzki | G01R 33/543 324/309 |

* cited by examiner

*Primary Examiner* — Rodney E Fuller
(74) *Attorney, Agent, or Firm* — Schiff Hardin LLP

(57) ABSTRACT

In a method and magnetic resonance apparatus for modification of a magnetic resonance actuation sequence, a parameter of the magnetic resonance actuation sequence is specified that, is categorized in one of a number of predefined categories for this parameter to which a boundary condition is linked. The boundary condition is taken into account and observed during the determination of a property of the pulses to be activated.

10 Claims, 2 Drawing Sheets

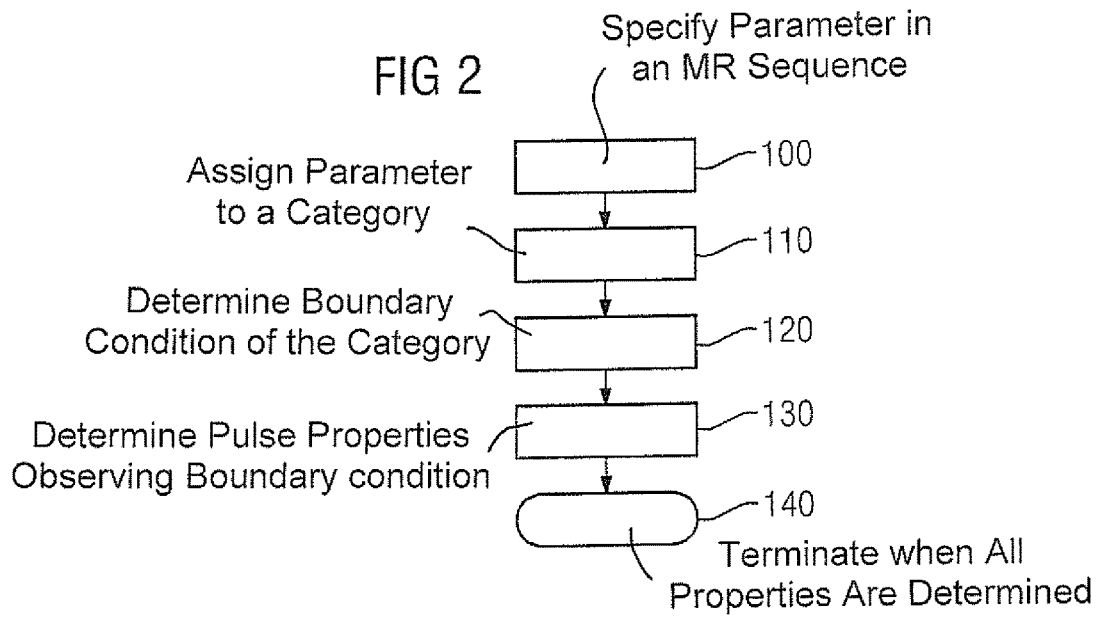
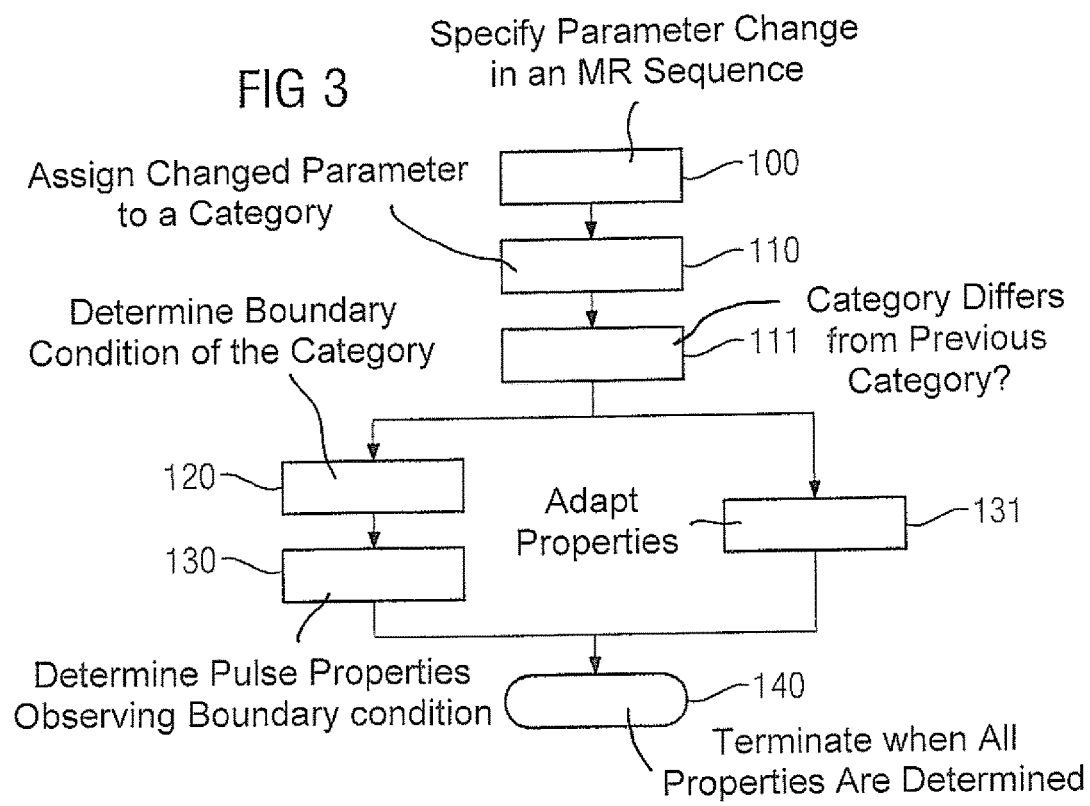

METHOD AND APPARATUS FOR MODIFICATION OF A MAGNETIC RESONANCE ACTUATION SEQUENCE

BACKGROUND OF THE INVENTION

Field of the Invention

The invention concerns a method for modification of a magnetic resonance actuation sequence with which a property of pulses to be activated or radiated is determined on the basis of the specification of a parameter of the magnetic resonance actuation sequence, as well as a magnetic resonance apparatus designed to implement such a method for modification of a magnetic resonance actuation sequence and a non-transitory, computer-readable data storage medium encoded with program code that causes such a method to be executed.

Description of the Prior Art

Magnetic resonance apparatuses are designed to generate images of patients, wherein the user of the magnetic resonance apparatus is able to enter various specifications that influence the images. The specifications are entered by the user before the start of the measurement. For example, the user can make inputs that ensure that the area to be scanned, i.e. the area to be depicted in images, covers the volume of interest of the patient and the images correspond to a desired contrast. To this end, the user can enter numerous specifications for the magnetic resonance apparatus (scanner thereof) that not only define the area to be scanned spatially but also relate to a magnetic resonance actuation sequence. Herein, the latter are termed sequence parameters.

Magnetic resonance actuation sequences are characterized by the temporal sequence of gradient pulses and radio-frequency (RF) pulses, as well as by their amplitude modulations and durations. Magnetic resonance actuation sequences are decisive in the determination of the contrast of images, but sequence parameters of a magnetic resonance actuation sequence are subject to numerous boundary conditions, which are established by the sequence parameters themselves or by further factors, such as the hardware of the magnetic resonance scanner or the choice of the spatial area to be scanned. The dependencies of the boundary conditions for a sequence parameter on other sequence parameters are derived from the principles of magnetic resonance tomography. For example, in a spin-echo sequence, the minimum repetition time is determined by the echo time.

The specification of a parameter by a user can have an effect on numerous other properties of the magnetic resonance actuation sequence, which, inter alia, have to be matched to the specified parameters and each other.

SUMMARY OF THE INVENTION

An object of the invention is to provide a method for the modification of a magnetic resonance actuation sequence, which determines a property of pulses to be activated, for example a sequence parameter, particularly efficiently on the basis of the specification of a parameter of the magnetic resonance actuation sequence. It is also an object of the invention to provide a magnetic resonance apparatus and a non-transitory computer-readable data storage medium designed to implement such a method.

This object is achieved in accordance with the invention by a method for modification of a magnetic resonance actuation sequence with which a property of pulses to be activated is determined on the basis of the specification of a parameter of the magnetic resonance actuation sequence that has the following steps.

A parameter of the magnetic resonance actuation sequence is specified in a processor.

The parameter is categorized in the processor in one of a number of predefined categories for this parameter.

A boundary condition is automatically determined in the processor on the basis of the category in which the parameter is categorized.

A property of the pulses to be activated is automatically determined in the processor while observing the boundary condition provided.

The magnetic resonance actuation sequence is then modified to include the determined property of the pulses, and the modified sequence is made available from the processor in electronic form as a control signal formatted to operate the data acquisition scanner of the magnetic resonance apparatus.

A magnetic resonance actuation sequence is defined by a temporal sequence of gradient pulses, typically temporary magnetic field gradients, radio-frequency (RF) pulses and time windows during which a radio-frequency signal is detected. The temporal sequence of these three elements is decisive for the image generated by means of the magnetic resonance device and there are various templates for the temporal sequence of these three elements. Each template defines a fundamental interaction of RF and gradient pulses and specifies the temporal sequence thereof. In this way, a template determines the basic character of the magnetic resonance actuation sequence and is also termed a sequence type. Examples' of sequence types include gradient-echo and turbo-spin-echo sequences, wherein the templates thereof differ in the sequence and number of RF pulses and gradient pulses and the purposes thereof. For example, in the case of gradient-echo sequences, the signal is refocused by means of gradient pulses, while turbo-spin-echo sequences use RF pulses.

At the start of each examination, the operator of the magnetic resonance apparatus, typically a medical technician, selects a template. Alternatively, the selection of the template can also take place automatically or be supported by an algorithm. The template specifies the sequence type and, following selection, is usually provided in a form containing all the information required to carry out a magnetic resonance actuation sequence of this sequence type. In particular, specific properties of the magnetic resonance actuation sequence are specified which are required to carry out said sequence and are matched to one another such that the magnetic resonance actuation sequence can be activated by the magnetic resonance device. These properties are not usually adapted to the patient to be examined. Since both patients and the reasons for an examination can differ, typically modification of the magnetic resonance actuation sequence is necessary, i.e. a change to existing properties of the magnetic resonance actuation sequence. The adaptation of the magnetic resonance actuation sequence to the patient typically requires a number of modifications of the properties specified following the selection of the template. These multiple modifications are typically performed one by one.

In addition to the template, the user can specify further properties of the magnetic resonance actuation sequence that do not alter its basic character. These include, for example, the volume of the patient or a resolution of the image to be generated. In addition, the basic character is retained if RF pulses and gradient pulses are changed in synchronism, for example a slice thickness adapted, an echo time extended or an RF pulse shape altered.

The echo time and the RF pulse shape are also examples of properties of pulses to be activated. Pulses to be activated can be RF pulses or gradient pulses and their properties are characterized by amplitude modulations and pulse durations, as well as their temporal profile and interaction. The slice thickness can be set (selected) by the duration of the RF pulses and the amplitude of the gradient pulses, as a result of which a change to the slice thickness also relates to properties of the pulses to be activated.

If, following the selection of a template for the magnetic resonance actuation sequence, the user specifies the aforementioned parameter, this is categorized in one of a number of categories that are predefined for that parameter. A category can be a sub-range of the set of values for the parameter. In addition to possible numerical values, the set of values can contain non-numerical values. Examples of non-numerical values are relative descriptions of sequence properties based on the loudness level of the magnetic resonance actuation sequence or the duration of RF pulses.

The combined quantity of the sub-ranges of the categories typically constitutes the entire value range of the parameter that can be selected by the user. The sub-ranges and hence the categories, are preferably disjoint.

The set of values of the parameter is discretized or rasterized and divided into categories. Each category is assigned a boundary condition and this is used for the determination of the property of the pulses to be activated. The boundary condition can be linked to the parameter and relate to a property of the pulses to be activated.

For example, the user may select as a parameter an RF pulse type with a defined RF bandwidth. A maximum slice thickness, for example, can be provided as the boundary condition for this RF pulse type with the defined RF bandwidth. Further boundary conditions are possible.

The method according to the invention is designed to determine or adapt a property of the pulses to be activated while observing the boundary condition provided. In the example of a given maximum slice thickness as a boundary condition, it is possible, for example, for the gradient amplitude of the slice selection gradient to be determined as a property of the pulses to be activated. It is also possible for further properties of the pulses to be activated to be determined that contain the at least one boundary condition provided. If a number of boundary conditions are to be linked to a parameter, the determination of the at least one property of the pulses to be activated is preferably provided while observing all the boundary conditions provided.

An advantage of this method is that the boundary condition obtained from the specification of the parameter for properties of the pulses to be activated and/or that relates to further parameters of the magnetic resonance actuation sequence, is predefined by the category, so that they are no longer determined following the specification of the parameter. Hence, the method enables more fluent handling for the user.

In an embodiment of the method, a linkage of the boundary condition with the categories is provided, such that the parameter, when categorized in a category, specifies a boundary condition for the property of the pulses to be activated. Thus the property of the pulses to be activated is determined observing the boundary condition in combination with the parameter.

This method ensures that the magnetic resonance actuation sequence uses the specified parameter and determines further properties of the pulses or the magnetic resonance actuation sequence, in particular further parameters, on the condition that the magnetic resonance actuation sequence can actually be activated by the magnetic resonance device.

A magnetic resonance actuation sequence typically cannot be activated by the magnetic resonance device if the combination of the selected parameter and further properties of the pulses or of the magnetic resonance actuation sequence place requirements on the hardware that the hardware is unable to fulfill. The term hardware encompasses all components of the magnetic resonance scanner. Each component can be used within specific, known limits. If the requirement of the magnetic resonance actuation sequence exceeds the limit of a component, the magnetic resonance actuation sequence cannot be activated by the magnetic resonance scanner. This limitation can be taken into account when matching the parameter with further properties so that the boundary condition is predefined such that the magnetic resonance actuation sequence can be actually activated by the magnetic resonance device.

Hence, when carrying out the method according to the invention, the magnetic resonance actuation sequence can start, follow the specified sequence and detect signals from which the computer of the magnetic resonance apparatus is able to generate medical image data.

This method ensures that there can be no abortion of the magnetic resonance actuation sequence, nor that the sequence is unable to start, i.e. cannot begin, to play out pulses. This embodiment supports a fluent workflow for the user.

In another embodiment of the method, the parameter of the magnetic resonance actuation sequence is not changed during the determination of the property of the pulses to be activated.

This embodiment of the method ensures that the parameter is used by the magnetic resonance actuation sequence as specified by the user. When the user has specified the parameter, the parameter is categorized in one of a number of categories and the boundary condition is provided on the basis of the category. The property of the pulses to be activated is then determined while observing the boundary condition provided and on the condition that the parameter is used with the value thereof as specified by the user.

Hence, the boundary condition specified by the category in which the parameter is categorized is relevant for properties of the pulses to be activated. These properties are adapted, but the parameter is not adapted to the boundary condition even if this is, or describes, a property of the pulses to be activated. In particular, this method means that the boundary condition, which is connected to the category of the parameter, can be fulfilled by the adaptation of properties of the pulses to be activated or further parameters without any change to the parameter being required for this purpose. An advantage of this embodiment is the planning certainty obtained for the user.

In a further embodiment of the invention, the property of the pulses to be activated is at least one of the following points: the timing of the pulses, the duration of the pulses and the maximum amplitude of the pulses. The pulses are typically RF pulses that cause certain nuclei to resonate and precess as spins so as to emit electromagnetic fields (RF signals) knows magnetic resonance signals. The pulses may also be gradient pulses that produce temporary magnetic field gradients that are used for spatial encoding. The timing of the pulses determines the temporal sequence of the pulses to be activated, i.e. the starting and ending point, plus the non-productive times in which no pulses are activated.

Together with the pulse duration and the amplitudes of the pulses, with gradient pulses including the amplitudes on all axes that can be actuated by the gradient coils, timing is a fundamental property of magnetic resonance actuation sequences.

The determination of the property of the pulses to be activated takes place on the basis of the boundary condition specified by a category and optionally further boundary conditions. In addition to the boundary condition specified by the category, it is also possible for various further (multiple) boundary conditions to be taken into account simultaneously.

In another embodiment of the invention, the parameter describes a spatial characteristic of a volume to be depicted by the magnetic resonance actuation sequence. Typically, with magnetic resonance actuation sequences, a differentiation is made between 2D and 3D methods, wherein a signal of a 3D volume is acquired in both methods. In the 2D method, a cuboid volume is typically divided into parallel slices, i.e. layers of a specific thickness, the slice thickness, wherein defined distances unequal to zero can separate the slices from one another. Cuboid volumes are also frequently selected in 3D methods. However, with this method, there is no subdivision into slices. Correspondingly, the volumes to be depicted can have various spatial characteristics, which are specified by the user as the aforementioned parameter. The spatial characteristics are important when adapting the volume to the patient or the area under examination. In this way, spatial characteristics can designate, for example, the spatial extent of the volume, the position, or the orientation thereof.

The orientation of the volume is preferably designated with reference to mutually orthogonal magnetic axes of the magnetic resonance scanner, wherein a first magnetic axis typically extends parallel to the constant basic magnetic field in the center of the cylindrical patient-receiving area in the magnetic resonance device. The first magnetic axis typically intersects a second and a third magnetic axis in the isocenter of the cylindrical patient-receiving area of the magnetic resonance scanner, wherein the second magnetic axis extends vertically and the third magnetic axis extends horizontally. The gradient coils are typically designed to generate magnetic field gradients along these three magnetic axes.

In the cylindrical patient-receiving area, the longitudinal axis of a patient, i.e. the straight line intersecting the head and centrally between both feet, generally runs approximately parallel to the first magnetic axis. The three magnetic axes span three layers defining three standardized orientations. These standardized orientations are known as sagittal, coronal and axial and represent the area under examination from different perspectives. For the adaptation of the orientation of a volume, generally one of the three standardized orientations is used as the original orientation and this is usually adapted in accordance with the anatomy of the patient. Adaptation generally entails a tilting of the volume, i.e. a rotation or circulation of the volume around at least one magnetic axis. Since the magnetic field gradients usually extend along the magnetic axes, depending upon the orientation of the volume, this results, for example, in different requirements for the magnetic field gradients, which can be taken into account by categorizing the parameter.

The spatial extent of the volume can be determined by the absolute size thereof. The position of the volume is preferably defined the geometric center point thereof and can also relate to properties of the pulses to be activated. For example, a position that does not coincide with the isocenter of the magnetic resonance device places higher requirements on the hardware of the magnetic resonance device than a position corresponding with the isocenter. Accordingly, it is also possible for categories and boundary conditions for the position of the volume to be defined as the parameter.

Since, during each examination, the spatial characteristic of a volume to be depicted by the magnetic resonance actuation sequence is typically adapted to the patient and a specific segment thereof, this is a parameter that is subject to frequent change. In particular, the categorization of this parameter and the predefinition of corresponding boundary conditions are particularly advantageous since this parameter relates to a number of further properties of pulses to be activated.

In a further embodiment of the invention, the boundary condition specifies available power of at least one gradient coil for the pulses to be activated. The power of a gradient coil can be defined by various parameters.

Gradient coils are typically characterized by their maximum achievable amplitude expressed as a quotient of a magnetic flux density and a length. A further characteristic for its power can be the slew rate. The slew rate is defined as the quotient of the maximum amplitude and the time required to achieve the maximum amplitude. Hence, the slew rate is a measure of the rate of change of a gradient. This measure is frequently a limitation for the new development of applications such as gradient-echo based neuroapplications requiring fast gradient changes.

When choosing a parameter that influences further parameters or properties of pulses to be activated that are dependent upon the available power of at least one gradient coil, the available power in one category of the parameter at of least one gradient coil can be provided as a boundary condition for this category. In this case, the available power designate the power that can be used by the properties of the pulses to be activated, i.e. the maximum nominal power.

In this case, the boundary condition for the available power of at least one gradient coil can be defined in dependence on the parameter in accordance with its category. If, for example, the parameter is the orientation of the volume to be depicted, this parameter can be discretized in categories in accordance with the rotation of the volume compared to at least one of the three magnetic axes. It is possible, for example, to select a value range of from −45° to 45° to describe the rotation with respect to a magnetic axis, since angles outside the value range can be described by a rotation relative to another magnetic axis with this value range. For example, it is possible for rasterization to be performed so that the parameter for rotations in the range from −15° to 15° is assigned to a first category, a second category encompasses the sub-ranges −30° to −15° and 15° to 30° and a third category encompasses the sub-ranges −45° to −30° and 30° to 45°. Typically, there are three gradient coils, which generate magnetic field gradients along the three mutually orthogonal magnetic axes.

If the orientation extends perpendicular to a magnetic axis, with Cartesian imaging, the signal acquisition takes place along the three magnetic axes and the maximum power of each gradient coil can be utilized. If the slice has a tilted orientation, with Cartesian imaging, the signal acquisition does not take place along the three magnetic axes and less power than the maximum power of a gradient coil is available.

Insofar, the first category, i.e. for rotations in the value range of −15° to 15°, can be allocated a greater available power for at least one gradient coil as a boundary condition than that for the second category. The available power for at least one gradient coil in the second category can in turn be selected higher than for the third category.

An advantage of the method is that a determination of the properties of pulses to be activated is performed taking account of the boundary condition, i.e. the available power of at least one gradient coil. If the method according to the invention were not applied and no categorization performed, during the determination of the properties of pulses to be activated, it would be necessary either to assume a fixed value for the available power of at least one gradient coil or to carry out a method step to determine this available power before the determination of the properties of pulses to be activated.

If, in accordance with the first option, a fixed value independent of the parameter were specified for the available power of at least one gradient coil, the properties of pulses to be activated would be determined while observing the fixed specified available power of at least one gradient coil and with the specification of the parameter. Since the fixed specified available power of at least one gradient coil would be independent of the choice of the parameter, the fixed specified available power of at least one gradient coil would typically be selected conservatively so that, for each parameter that could be specified, the properties of pulses to be activated could be determined and the resultant magnetic resonance actuation sequence could be activated. Consequently, the available power of the gradient coil would typically not be utilized and this would, for example, restrict innovative gradient-echo based neuroapplications requiring fast gradient changes.

The second option for compensating a missing categorization, i.e. the embodiment of a method step for the determination of the available power of at least one gradient coil before the determination of the properties of pulses to be activated, is time-consuming and impairs the fluency of operation by the user.

In another embodiment of the method, the categories are predefined by a value range for the parameter being discretized into at least two sub-ranges, each sub-range describing exactly one category, and the at least two categories are each allocated at least one boundary condition.

Consequently, this method for defining the categories uses the approach that, on the basis of the value range of the parameter, this value range is divided into at least two sub-ranges. Consequently, each of these sub-ranges forms the basic framework for a category for which at least one boundary condition is determined. The boundary condition preferably takes account of restrictions obtained with reference to the parameter for further properties of pulses to be activated.

The magnetic resonance actuation sequence is preferably activated with the specification of a parameter and adaptation of the at least one property of the pulses to be activated while observing the at least one boundary condition obtained from the category of the parameter.

This method for the definition of the categories is preferably performed in advance of the actual method for the modification of a magnetic resonance actuation sequence. It can be performed separately before the examination of a patient with the magnetic resonance device, or once only before the delivery of the magnetic resonance device. This method is typically performed by a developer of the method, or a programmer develops a program for the implementation of the method. The results of the method, i.e. the categories together with the associated boundary conditions can be stored in a memory of the magnetic resonance apparatus and hence can be called up during the examination of a patient.

An advantage of this embodiment is that linked sub-ranges of the set of values of the parameter can be assigned to one category and hence continuous changes can be made within the sub-ranges without any assignment to a new category taking place.

In a further embodiment of the invention, the categories are predefined by possible options for the boundary condition being divided into at least two categories, and the parameter to be specified is assigned to precisely one category.

This method again relates to the definition of the categories and is preferably performed in advance of the actual method for the modification of a magnetic resonance actuation sequence.

This method for the determination of the categories differs from the preceding embodiments in that the categories are defined not on the basis of the value range of the parameter by the conditions or restrictions resulting from the parameter for at least one property of the pulses to be activated. In dependence upon the parameter, various conditions or restrictions influence at least one property of the pulses to be activated. These conditions or restrictions represent possible options for the boundary condition that are expediently divided into at least two categories. Preferably, possible options for boundary conditions are combined and categorized such that the options combined in one category have similar impacts on a property of the pulses to be activated.

For example, for the orientation of the volume as the parameter, the power of at least one gradient coil can be identified as a possible restriction or boundary condition for a further property of pulses to be activated. On the basis of the object of a magnetic resonance actuation sequence that can be activated, the requirements of pulses to be activated can be checked with respect to the power of at least one gradient coil for the entire value range of the parameter, and the categories defined in accordance with the requirements for the power of at least one gradient coil.

This method for the definition of the categories is preferably performed not as a component of the method for the modification of a magnetic resonance actuation sequence, but separately before the examination of a patient with the magnetic resonance device. The method can be performed once and the result can be stored in a memory of the magnetic resonance apparatus.

An advantage this embodiment of the method is that the categories are selected such that the boundary conditions can be utilized as well as possible in accordance with the number of categories and the lowest possible number of restrictions for the magnetic resonance actuation sequence result.

In another embodiment of the method, the determination of the property of the pulses to be activated while observing the boundary condition provided during the specification of the parameter that differs from the original parameter, takes place only when the parameter is categorized in a category that differs from the category, in which the original parameter was categorized.

One condition for the method is that the parameter specified by the user replaces an original parameter. The original parameter can be determined in a previous implementation of the method according to the invention or provided with the choice of the sequence type. In this variant of the method according to the invention, the user specifies a parameter that differs from the original parameter and replaces that original parameter. In this implementation of the method according to the invention, the original parameter has not yet been changed before the aforementioned specification of the parameter.

Consequently, this embodiment of the method allows a user, during the planning of the magnetic resonance actuation sequence, by the specification of the parameter, to make a change within a sub-range of said user's value range, which is assigned to a category, without the determination of the property of the pulses to be activated while observing the boundary condition provided. All changes within one category are linked to the same boundary conditions for the property of the pulses to be activated. Therefore, if the user specifies a parameter that is assigned to the same category as the original parameter, the determination of the property of the pulses to be activated while observing the boundary condition provided no longer has to take place.

In addition to the boundary condition provided, it is also possible for the choice of the parameter to relate to at least one property of the pulses to be activated. It can thus be necessary to adapt and carry out at least one property of the pulses to be activated to the parameter. This process is not affected by the categorization and the boundary condition provided is unchanged. The adaptation of at least one property of the pulses to be activated to the parameter takes place with a constant boundary condition and is typically associated with lower computing outlay than the determination of the property of the pulses to be activated while observing the boundary condition provided.

Consequently, an advantage of this embodiment that the time-consuming determination of the property of the pulses to be activated while observing the boundary condition provided takes place only when the user selects a parameter that is assigned to a category other than the original parameter. The determination of the property of the pulses to be activated while observing the boundary condition provided typically requires calculations that are more extensive than those for the adaptation of the property of the pulses to be activated to the parameter. The determination of the property of the pulses to be activated while observing the boundary condition provided can impair the ease of adaptation of the magnetic resonance actuation sequence by the user, and therefore a less frequent determination is advantageous.

If the categorization of the parameter according to the invention into predefined categories were to be omitted, it would be necessary, in addition to the determination of the property of the pulses to be activated, for the boundary condition resulting from the parameter for the property of the pulses to be activated to be determined on each change made to the parameter.

The present invention also encompasses a magnetic resonance apparatus for modification of a magnetic resonance actuation sequence with which a property of pulses to be activated is determined on the basis of the specification of a parameter of the magnetic resonance actuation sequence. The apparatus has a processor in which the parameter of the magnetic resonance actuation sequence is specified. The parameter is categorized in the processor in one of a number of predefined categories for this parameter. A boundary condition is automatically determined in the processor on the basis of the category in which the parameter is categorized. A property of the pulses to be activated is automatically determined in the processor while observing the boundary condition provided. The magnetic resonance actuation sequence is then modified to include the determined property of the pulses, and the modified sequence is made available from the processor in electronic form as a control signal formatted to operate the data acquisition scanner of the magnetic resonance apparatus.

With the specification of a parameter by an anticipated categorization of that parameter, the invention enables the efficient determination of properties of pulses to be activated by magnetic resonance actuation sequences. This enables fluent adaptation for the user to be guaranteed. This is also supported by the fact that it is ensured that the magnetic resonance actuation sequence will not be aborted during this process or will be unable to start, i.e. cannot begin, to play out pulses. In particular, the invention observes the specification of the parameter by the user. The parameter can describe a spatial characteristic of a volume to be depicted, since this parameter has a far-reaching impact on further properties of pulses to be activated and accordingly they only need to be determined on a change of category of the parameter. In particular, the choice of the available power of a gradient coil of the gradient coil arrangement as a boundary condition is advantageous, since this limits the functionality of innovative magnetic resonance actuation sequences, for example in the field of neuroapplications.

The advantages of the magnetic resonance apparatus according to the invention substantially correspond to the advantages of the method according to the invention for the modification of a magnetic resonance actuation sequence with which a property of pulses to be activated is determined on the basis of the specification of a parameter of the magnetic resonance actuation sequence, as explained in detail above. Features, advantages or alternative embodiments mentioned above are also applicable to the apparatus.

The present invention also encompasses a non-transitory, computer-readable data storage medium encoded with programming instructions, the storage medium being loadable into a control computer of a magnetic resonance apparatus, and the programming instructions, when executed by the control computer, causing the control computer to operate the magnetic resonance apparatus so as to implement the method in accordance with the invention as described above.

BRIEF DESCRIPTION OF THE DRAWINGS

FIG. 2 is flowchart of an embodiment of the method according to the invention.

FIG. 3 is a flowchart of the embodiment of the method according to the invention.

DESCRIPTION OF THE PREFERRED EMBODIMENTS

Figure 1:
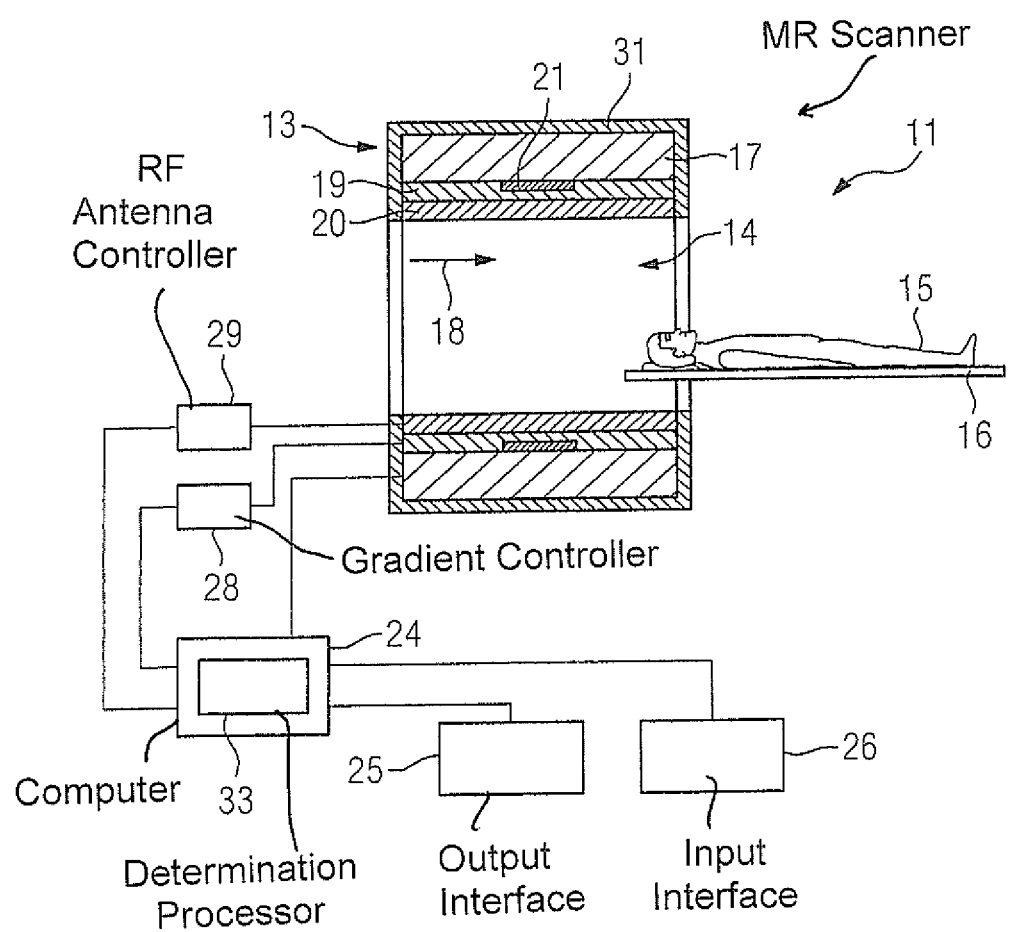
FIG. 1 schematically illustrates a magnetic resonance apparatus according to the invention.

FIG. 1 is a schematic depiction of a magnetic resonance apparatus 11 according to the invention. The magnetic resonance apparatus 11 has a data acquisition scanner 13 with a basic field magnet 17 for the generation of a strong and constant basic magnetic field 18. The scanner 13 also has a cylindrical patient-receiving area 14 for receiving a patient 15. The patient-receiving area 14 is cylindrically enclosed in a circumferential direction by the scanner 13 and so has a cylindrical shape. The patient 15 can be moved into the patient-receiving area 14 by a patient support 16 of the magnetic resonance apparatus 11. To this end, the patient support 16 has a table arranged so as to be movable within the scanner 13. The scanner 13 is screened from the outside by a housing shell 31.

The scanner 13 further has a gradient coil arrangement 19 with a gradient coil 21 for generating magnetic field gradients that are used for spatial encoding during imaging. The gradient coil arrangement 19 is operated by a gradient controller 28. The scanner 13 also has a radio-frequency antenna 20, which, in the case shown, is embodied as a body coil fixedly integrated in the scanner 13, and a radio-frequency controller 29. The radio-frequency antenna 20 is operated by the radio-frequency antenna controller 29 so as to radiate radio-frequency magnetic resonance actuation sequences into an examination chamber, which is substantially formed by the patient-receiving area 14. Radio-frequency pulses, such as excitation pulses, in the actuation sequence cause certain nuclear spins in the patient 15 to be deflected from the polarization that is established by the basic magnetic field 18. As those excited spins relax, they emit radio-frequency signals, called magnetic resonance signals. The radio-frequency antenna 20 is further embodied to receive the magnetic resonance signals from the patient 15.

To control the basic field magnet 17, the gradient controller 28 and the radio-frequency antenna controller 29, the magnetic resonance apparatus 11 has a computer 24. The computer 24 controls the magnetic resonance apparatus 11 centrally, such as for the performance of a predetermined imaging gradient-echo sequence. Control information such as imaging parameters, and reconstructed magnetic resonance images, can be displayed to the user on an output interface 25, for example on at least one monitor, of the magnetic resonance apparatus 11. The magnetic resonance apparatus 11 also has an input interface 26 via which information and/or parameters can be entered by a user during a measuring process. The control computer 24 can embody any or all of the gradient controller 28, the radio-frequency antenna controller 29, the display output interface 25, and the input interface 26.

The magnetic resonance apparatus 11 is configured for the execution of a method according to the invention.

The magnetic resonance apparatus 11 depicted can have further components that are normally present in magnetic resonance apparatuses. The general manner of operation of a magnetic resonance apparatus is known to those skilled in the art, so a more detailed description is not necessary herein.

FIG. 2 is a flowchart of a first embodiment of the method according to the invention for the modification of a magnetic resonance actuation sequence. The object is to generate images from an area under examination of a patient 15 located in the patient-receiving area of a scanner 13 by execution of a magnetic resonance actuation sequence. Generally, initially, the basic character of the magnetic resonance actuation sequence is determined by the choice of the sequence type. Following that choice, typically a magnetic resonance actuation sequence is provided for execution, the properties of which, for example, relate to the volume to be depicted but are not matched to the object under examination. The user of the magnetic resonance apparatus 11 typically makes changes to the object under examination for the individual adaptation. It is then possible to proceed in accordance with the method according to the invention.

In a first method step 100, the user specifies a parameter via the input interface 26. In magnetic resonance imaging, various properties of magnetic resonance actuation sequences are dependent upon one another, which is why the change of a parameter typically has an effect on further properties of the magnetic resonance actuation sequence. The following changes are made by a determination processor 33 of the computer 24 of the magnetic resonance apparatus 11: in a method step 110, the parameter is assigned to a predefined category. The parameter can be assigned to precisely one category, for which further information is kept available. This further information contains a boundary condition applicable to further properties of the pulses to be activated and on compliance with which the magnetic resonance actuation sequence can be activated. This boundary condition is provided in method step 120 for the category provided which was assigned to the parameter. In method step 130, properties of the pulses to be activated are determined while observing the boundary condition. Typically, all changed properties of the pulses to be activated are dependent upon the boundary condition and/or dependent upon properties of pulses to be activated that are adapted to the boundary condition. If the determination of all necessary properties of the magnetic resonance actuation sequence takes place on the basis of the changed parameter, the method according to the invention is terminated in method step 140 and the properties of the magnetic resonance actuation sequence can be displayed to the user for example on a unit 25.

When all the properties of the magnetic resonance actuation sequence dependent upon the parameter have been adapted, the method for the modification of a magnetic resonance actuation sequence is concluded. The user can then make further changes and hence, for example, specify a new value for the parameter or change another parameter. Preferably, predefined categories exist for all variable parameters each of which having at least one associated boundary condition so that the method can be carried on the specification of each further parameter.

Following the conclusion of the modification of the magnetic resonance actuation sequence on the basis of specifications by the user, this magnetic resonance actuation sequence can be carried out by the magnetic resonance apparatus 11. The control computer 24 is configured to operate the scanner 13 to perform the magnetic resonance actuation sequence with the specified properties and the gradient controller 28 with a gradient coil 21 and/or the radio-frequency antenna controller 29 in accordance with the specifications of the magnetic resonance actuation sequence. During the performance of the magnetic resonance actuation sequence, data or signals are recorded by the scanner 13. This data or signals can be processed and reconstructed to form magnetic resonance images, which can be displayed on the output interface 25. The specification of the parameter by the user can influence the magnetic resonance images. For example, the choice of a spatial orientation is reflected in the level of the magnetic resonance images depicted. If, for example, the change to the parameter relates to the timing of the pulses, the contrast of the magnetic resonance images can be changed, i.e. the difference in brightness between dark and light areas is intensified or attenuated.

FIG. 3 is a flowchart of a second embodiment of the method according to the invention for the modification of a magnetic resonance actuation sequence. The object is to generate images from an area under examination of a patient 15 located in the patient-receiving area of the scanner 13 by execution of a magnetic resonance actuation sequence. Generally, initially the basic character of the magnetic resonance actuation sequence is determined by the choice of sequence type. Following the choice, typically a magnetic resonance actuation sequence is available which can be activated with properties, which, for example, relate to the volume to be depicted but are not matched to the object under examination. The user of the magnetic resonance device typically makes changes for the individual adaptation to the object under examination.

In this case, as in the first embodiment of the method according to the invention, which was described with reference to FIG. 2, the user, specifies a parameter in method step 100 and, according to method step 110, assigns the parameter to a category. In the second implementation of the method according to the invention, the assignment of the parameter 110 and all following method steps take place by operation of the determination processor 33 of the control computer 24 of the magnetic resonance apparatus 11. In the second embodiment of the method according to the invention, the categorization of the parameter 110 is followed by a further method step 111, which performs a check as to whether the category to which specified parameter was assigned differs from the category to which the original parameter belonged before the change.

This check can produce precisely two results: in a first case the two categories are the same, in a second case they differ from one another.

In the first case, further method steps for the provision of a boundary condition and for the determination of the properties of pulses to be activated while observing the boundary condition provided are not necessary since no changed boundary conditions can be provided to which the an adaptation is necessary. The parameter can influence at least one property of the pulses to be activated, wherein an adaptation of the property of the pulses to be activated to the parameter can be necessary. This adaptation of the property of pulses to be activated to the parameter takes place in method step 131. Optionally, the parameter does not influence any property of the pulses to be activated. In this case, no adaptation has to be performed. This is followed directly by the conclusion of the method according to the invention, i.e. the end in method step 140, wherein the properties of the magnetic resonance actuation sequence can be displayed to the user for example on the output interface 25.

In the second case, i.e. with the specification of the parameter that causes a change to the category, the check on the category (111) is followed by the provision of the boundary condition in method step 120 and the determination of the property of pulses to be activated taking account of the boundary condition in method step 130, before the method is concluded in step 140.

In summary, the invention relates to a method for the modification of a magnetic resonance actuation sequence with which a property of pulses to be activated on the basis of the specification of a parameter of the magnetic resonance actuation sequence is determined particularly efficiently in that, following the specification of a parameter, said parameter is categorized in one of a number of predefined categories for this parameter to which a boundary condition is linked that is provided and taken into account and observed during the determination of a property of the pulses to be activated.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for modification of a magnetic resonance actuation sequence to be executed by a magnetic resonance data acquisition scanner, said magnetic resonance actuation sequence comprising pulses, selected from the group consisting of radio-frequency pulses and gradient pulses, each of said pulses having at least one property associated therewith, said method comprising:

providing a processor with a specification of a parameter of said magnetic resonance actuation sequence, said parameter contributing to setting a spatial characteristic of a volume of an examination subject that is to be depicted in an image generated from said magnetic resonance actuation sequence, said spatial characteristic being at least one of a position, orientation and spatial extent of said volume;

in said processor, automatically categorizing said parameter in one of a plurality of predefined categories for said parameter, each of said predefined categories having at least one boundary condition associated therewith;

in said processor, selecting a boundary condition that corresponds to said at least one boundary condition of the category in which said parameter is categorized the category in which said parameter is categorized;

in said processor, determining at least one property of at least one of said pulses while observing said boundary condition;

in said processor, modifying said magnetic resonance actuation sequence dependent on said at least one determined property that was determined while observing said at least one boundary condition of the category in which said parameter is categorized, thereby producing a modified magnetic resonance acquisition sequence; and making the modified magnetic resonance acquisition sequence available from the processor in electronic form as a control signal formatted to operate said magnetic resonance data acquisition scanner to execute said modified magnetic resonance data acquisition sequence.

2. A method as claimed in claim 1 comprising, in said processor, linking said boundary condition to said plurality of categories so that, when said parameter is categorized in a category, the categorized parameter specifies said boundary condition as a boundary condition for said property of said at least one of said pulses so that the boundary condition is observed in combination with said parameter.

3. A method as claimed in claim 1 wherein said processor maintains said parameter unchanged bearing determination of said at least one property of said at least one of said pulses.

4. A method as claimed in claim 1 comprising selecting said at least one property of said at least one of said pulses from the group consisting of a timing of said at least one pulse relative to another of said pulses, a duration of said at least one pulse, and a maximum amplitude of said at least one pulse.

5. A method as claimed in claim 1 comprising determining said boundary condition as a specification of an available power of at least one gradient coil of said magnetic resonance data acquisition scanner that occurs during execution of said magnetic resonance actuation sequence.

6. A method as claimed in claim I comprising predefining said categories in said processor to divide a value range for said parameter into at least two sub-ranges, with each sub-range describing exactly one of said categories and with the respective categories of said at least two sub-ranges being allocated to one boundary condition.

7. A method as claimed in claim 1 comprising predefining said categories in said processor by defining one boundary condition for each category and assigning said parameter to precisely one category.

8. A method as claimed in claim 1 wherein said magnetic resonance data acquisition sequence comprises said parameter as an original parameter, and determining said at least one property of at least one of said pulses while observing said boundary condition only if said parameter specified in said processor differs from said original parameter by said parameter being categorized in a category that differs from a category in which said original parameter is categorized.

9. A magnetic resonance apparatus comprising:

a magnetic resonance data acquisition scanner;

a processor provided with a specification of a parameter of a magnetic resonance actuation sequence to be executed by said magnetic resonance data acquisition scanner, said magnetic resonance actuation sequence comprising pulses, selected from the group consisting of radio-frequency pulses and gradient pulses, each of said pulses having at least one property associated therewith, said parameter contributing to setting a spatial characteristic of a volume of an examination subject that is to be depicted in an image generated from said magnetic resonance actuation sequence, said spatial characteristic being at least one of a position, orientation and spatial extent of said volume;

said processor being configured to automatically categorize said parameter in one of a plurality of predefined categories for said parameter, each of said predefined categories having at least one boundary condition associated therewith;

said processor being configured to select a boundary condition dependent on the category in which said parameter is categorized;

said processor being configured to determine at least one property of at least one of said pulses while observing said selected boundary condition;

said processor being configured to modify said magnetic resonance actuation sequence dependent on said at least one determined property, that was determined while observing said at least one boundary condition of the category in which said parameter is categorized thereby producing a modified magnetic resonance acquisition sequence; and said processor being configured to make the modified magnetic resonance acquisition sequence available from the processor in electronic form as a control signal and to operate said magnetic resonance data acquisition scanner to execute said modified magnetic resonance data acquisition sequence.

10. A non-transitory, computer-readable data storage medium encoded with programming instructions, said storage medium being loaded into a control computer of a magnetic resonance apparatus, that comprises a magnetic resonance data acquisition scanner, and said programming instructions causing said control computer to:

receive a specification of a parameter of said magnetic resonance actuation sequence, said parameter contributing to setting a spatial characteristic of a volume of an examination subject that is to be depicted in an image generated from said magnetic resonance actuation sequence, said spatial characteristic being at least one of a position, orientation and spatial extent of said volume;

categorize said parameter in one of a plurality of predefined categories for said parameter, each of said predefined categories having at least one boundary condition associated therewith;

select a boundary condition that corresponds to said at least one boundary condition of the category in which said parameter is categorized the category in which said parameter is categorized;

determine at least one property of at least one of said pulses while observing said boundary condition;

modify said magnetic resonance actuation sequence dependent on said at least one determined property that was determined while observing said at least one boundary condition of the category in which said parameter is categorized, thereby producing a modified magnetic resonance acquisition sequence; and make the modified magnetic resonance acquisition sequence available from the control computer in electronic form as a control signal formatted to operate said magnetic resonance data acquisition scanner to execute said modified magnetic resonance data acquisition sequence.

* * * * *